US012586756B2

(12) United States Patent (10) Patent No.: US 12,586,756 B2
Hassan et al. (45) Date of Patent: Mar. 24, 2026

(54) SYSTEMS AND METHODS FOR ALUMINUM ION BEAM GENERATION SOURCE TECHNOLOGY

(71) Applicant: II-VI Advanced Materials, LLC, Pine Brook, NJ (US)

(72) Inventors: Ahmet Hassan, Wilmington, DE (US); Raymond Pong, Wilmington, DE (US); Jeremy Turcaud, Wilmington, DE (US); John Schuur, Wilmington, DE (US)

(73) Assignee: II-VI DELAWARE, INC., Wilmington, DE (US)

( * ) Notice: Subject to any disclaimer, the term of this patent is extended or adjusted under 35 U.S.C. 154(b) by 70 days.

(21) Appl. No.: 18/426,555

(22) Filed: Jan. 30, 2024

(65) Prior Publication Data

US 2024/0266143 A1 Aug. 8, 2024

Related U.S. Application Data

(60) Provisional application No. 63/483,151, filed on Feb. 3, 2023.

(51) Int. Cl.
*H01J 37/317* (2006.01)
*H01L 21/04* (2006.01)

(52) U.S. Cl.
CPC ........ *H01J 37/3171* (2013.01); *H01L 21/046* (2013.01)

(58) Field of Classification Search
None
See application file for complete search history.

(56) References Cited

U.S. PATENT DOCUMENTS

| | | | |
|---|---|---|---|
| 2002/0130277 A1* | 9/2002 | Halling ............... | H01J 37/3171 250/492.21 |
| 2003/0197129 A1 | 10/2003 | Murrell et al. | |
| 2004/0056210 A1* | 3/2004 | Scherer .................. | G04F 10/10 250/492.1 |
| 2011/0005461 A1* | 1/2011 | Vandermeulen ........ | H01J 37/08 315/111.21 |
| 2021/0375585 A1 | 12/2021 | Patel et al. | |
| 2023/0369006 A1* | 11/2023 | Wright ............... | H01J 37/3244 |
| 2023/0369007 A1* | 11/2023 | Wright ............... | H01J 37/3244 |

FOREIGN PATENT DOCUMENTS

| | | |
|---|---|---|
| CN | 217359716 U | 9/2022 |
| EP | 3699946 A1 | 8/2020 |
| GB | 2429834 A | 3/2007 |

OTHER PUBLICATIONS

European Office Communication with extended search report Appln No. 24155544.0 dated Jun. 11, 2024.

* cited by examiner

*Primary Examiner* — Kenneth B Wells

(74) *Attorney, Agent, or Firm* — McAndrews, Held & Malloy, Ltd.

(57) ABSTRACT

An implantation device is disclosed. In particular, an implantation device includes an ionization chamber having a cathode and a repeller arranged therein. A source of aluminum ions is including within the chamber, wherein a displacing gas is introduced to the chamber during an ionization process to yield a beam of energetic aluminum ions.

23 Claims, 4 Drawing Sheets

SYSTEMS AND METHODS FOR ALUMINUM ION BEAM GENERATION SOURCE TECHNOLOGY

CROSS REFERENCE TO RELATED APPLICATIONS

This application is a Non-Provisional Patent Application of U.S. Provisional Patent Application No. 63/483,151 entitled "Systems And Methods For aluminum Ion Beam Generation Source Technology" filed Feb. 3, 2023, which is herein incorporated by reference in its entirety.

BACKGROUND

Integrated circuits and devices often require doping of certain areas, which can be done by using ions. Generating such ions can be challenging, as some atoms/molecules require extreme conditions to ionize.

The subject matter of the present disclosure is directed to avoiding the negative aspects of the problems set forth above.

SUMMARY OF THE DISCLOSURE

According to the present disclosure, an implantation device is provided. In particular, an implantation device includes an ionization chamber having a cathode and a repeller arranged therein. A source of aluminum ions is included within the chamber, wherein a displacing gas is introduced to the chamber during an ionization process to yield a beam of energetic aluminum ions.

These and other features of the present disclosure will become more fully apparent from the following description and appended claims, as set forth hereinafter.

BRIEF DESCRIPTION OF THE DRAWINGS

To further clarify the above and other features of the present disclosure, a more particular description of the subject matter will be rendered by reference to specific examples thereof, which are illustrated in the appended drawings. It is appreciated that these drawings depict only some examples of the subject matter and are therefore not to be considered limiting of its scope.

FIG. 1 illustrates a schematic of an example ion implantation system employing an ion implantation device.

DETAILED DESCRIPTION OF THE DISCLOSURE

Figure 1A:
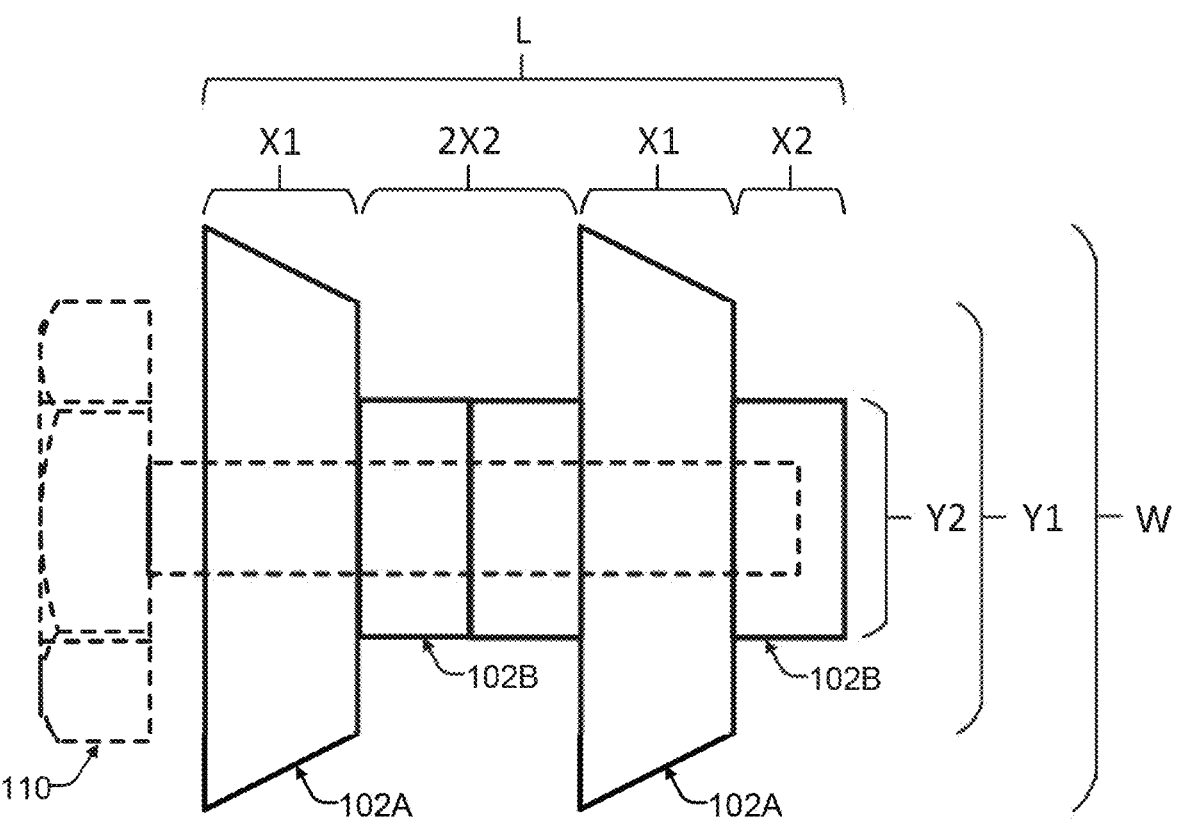
FIGS. 1A and 1B illustrate alternative views of the example ion implantation device of FIG. 1.

An implantation device is disclosed. In particular, an implantation device includes an ionization chamber having a cathode and a repeller arranged therein. A source of aluminum ions is within the chamber, wherein a displacing gas is introduced to the chamber during an ionization process to yield a beam of energetic aluminum ions.

Integrated circuits and devices made on semiconducting substrates (e.g., silicon carbide) require doping of certain areas, which can be done by implantation of ions (e.g., aluminum ions). Generating aluminum ions within a plasma source is challenging, however, as aluminum is not in a gaseous state and the chemical forms of aluminum compounds found on earth require extreme conditions to ionize.

Conventional technologies for generating an aluminum ion beam for ion implantation is based on using an aluminum iodide (AlI3) chemical and ionizing it in a plasma source. This technology yields a low beam current (e.g., approximately 2 mA), and requires severe maintenance and cleaning between each source change (e.g., a green-to-green time of approximately 24 hours).

The disclosed implantation device uses an aluminum oxide source (e.g., an Al2O3 ceramic plug) to generate a plasma source. For example, the source (e.g., a plug) can be inserted into an ionizing chamber, such as through a wall of a housing enclosing the chamber. In some examples, the source can be wholly arranged within the chamber, either mounted to an internal chamber surface, and/or formed as part of the chamber/housing itself. A displacing gas is used to provide the chemically enhanced sputter process required to ionize the Al2O3 source into aluminum ions.

Advantageously, employing the disclosed implantation device yields higher beam current (e.g., approximately 3.5 mA), which serves to increase processing throughput. The disclosed implantation device also results in dramatically reduced cleaning time (e.g., a "green-to-green" time of approximately one hour).

As described herein, ion implantation is a material surface treatment process using energetic beams to implant ions into a target material. The characteristics of the resulting implanted material are thereby changed, including physical and/or chemical properties thereof to obtain desired device characteristics.

The disclosed implantation device can be employed in an ion implantation system and/or method to support the microelectronics industry. The ion implantation systems and/or methods provide high-energy and compound material implanting (e.g., for 2-inch to 12-inch material substrates). A variety of sources can be used to provide the ions for implantation, and using aluminum provides certain advantages, as disclosed herein.

FIG. 1 illustrates a schematic of an example ion implantation system 100. The system 100 includes a housing 112 that defines an ionization chamber. An ion implantation device 102 (e.g., an aluminum Al2O3 source) can be inserted into the chamber via an opening 108. Within the housing is one or more of a repeller 104 and/or a cathode 106, to generate aluminum ion beams. Although shown as inserted through a wall of the chamber in the example of FIG. 1, the ion implantation device 102 (e.g., the aluminum Al2O3 source plug) can be wholly arranged within the chamber, either mounted to an internal chamber surface, and/or formed as part of the chamber/housing 112 itself.

As shown in FIG. 1, a fastener 110 (e.g., a bolt, screw, rivet, etc.) can be used to secure the ion implantation device 102 to the wall of the housing 112. For example, the ion implantation device 102 may include a threaded channel 110A to receive the fastener 110. Channel 110A may extend through all or a portion of the ion implantation device 102. In particular, the ion implantation device 102 may include one or more segments 102A, 102B, one or more of which may be configured with all or part of the threaded channel 110A. Thus, each segment may be separately removable/replaceable, such that a selected order and/or number of different segments can result in a different ion implantation device 102. In some examples, a damaged and/or degraded segment may be individually replaced. Further, one or more of the segments can be designed with varying dimensions, geometries, and/or materials, as a list of non-limiting examples.

Figure 1B:
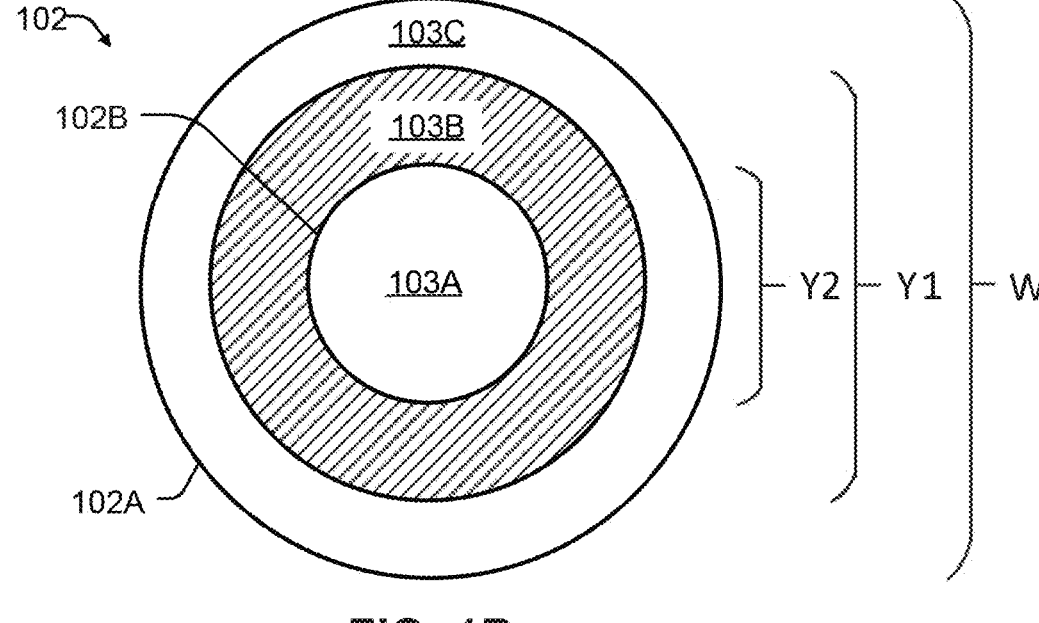

The example ion implantation device 102 illustrated in FIGS. 1, 1A and 1B is shown with two frustroconical segments 102A and three cylindrical segments 102B. In these examples, a first segment 102A is arranged in contact with a wall of the housing 112, such that tightening of the fastener 110 creates a clamp on the wall between the first segment 102A and the fastener 110. Two cylindrical segments 102B are arranged between the first segment 102A and a second segment 102A, and another cylindrical segment 102B is arranged at an end of the ion implantation device 102 extending from the wall into the chamber.

As shown in the detailed image provided in FIG. 1A, the ion implantation device 102 has a length L (e.g., approximately 14.7 mm) as measured from the wall of the housing. The length L is defined by lengths of each of the five segments. For example, each of the two segments 102A has a first length X1 (e.g., approximately 3.3 mm), and each of the three segments 102B have has a second length X2 (e.g., approximately 2.7 mm).

Further, each of the two segments 102A has a base diameter W (e.g., approximately 13 mm) and an inner diameter Y1 (e.g., approximately 10 mm), and each of the three segments 102B have a central diameter Y2 (e.g., approximately 8 mm). Here, the base diameter of the segments 102A is equal to the widest diameter of the ion implantation device 102, as a center point of each segment is aligned with a common axis 105. In some examples, however, one or more segments are not symmetrical (e.g., have a non-uniform geometry), and/or are misaligned from the common axis.

FIG. 1B illustrates a view of the ion implantation device 102 from the chamber. As shown, an exposed flat surface 103A of a cylindrical segment 102B has the diameter Y2. Partially exposed flat or planar surface 103B of a frustroconical segment 102A has the diameter Y1. A beveled (e.g., angled, slanted, sloped, gradient) surface 103C of the frustroconical segment 102A extends to a flat or planar base surface opposite the surface 103B, the base surface having the diameter W.

Although the provided example ion implantation device 102 is illustrated as having particular dimensions (e.g., internal, external, proportional, etc.), such examples are representative and do not limit the ion implantation device to such dimensions. For instance, the ion implantation device 102 may be comprised of multiple segments of a similar shape (e.g., cylindrical, rectangular, triangular, pyramidal, etc.). In some examples, the ion implantation device 102 may be comprised of a single segment having a geometrically consistent exterior in each of three dimensions (e.g., spherical) and/or one or more dimensions (e.g., cylindrical, rectangular, pyramidal, etc.).

In some examples, each segment of the ion implantation device 102 is formed of a material to provide ions (e.g., Al2O3), wherein in other examples one or more of the segments are formed of a different material. The different material may be another type of ion source, and/or a material selected to provide structure, heat dispersion, and/or insulation. For example, metals, semiconductors, alloys, and/or other suitable materials may be used as an ion source.

In some examples, a surface of one or more segments of the ion implantation device 102 is machined to have a smooth finish. In some examples, a surface of one or more segments may have an irregular or rough surface. Further, some example ion implantation devices may be treated with a coating or other surfactant to provide or enhance one or more characteristics of the ion implantation device.

Figure 2A:
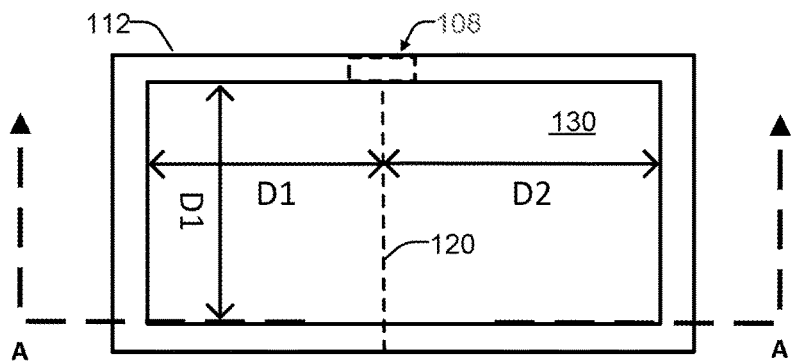
FIGS. 2A and 2B illustrate perspective views of a housing of the example ion implantation system of FIG. 1.

FIG. 2A illustrates an overview of the housing 112 supporting the example ion implantation device 102 of FIGS. 1-1B. As shown, the housing 112 has a length and width corresponding to a generally rectangular shape, although not limited to such a geometry. As shown in FIG. 2A, ionization chamber 130 has a width of D1 (e.g., approximately 33 mm) and a length equal to D1 and D2 (e.g., approximately 43 mm).

Figure 2B:
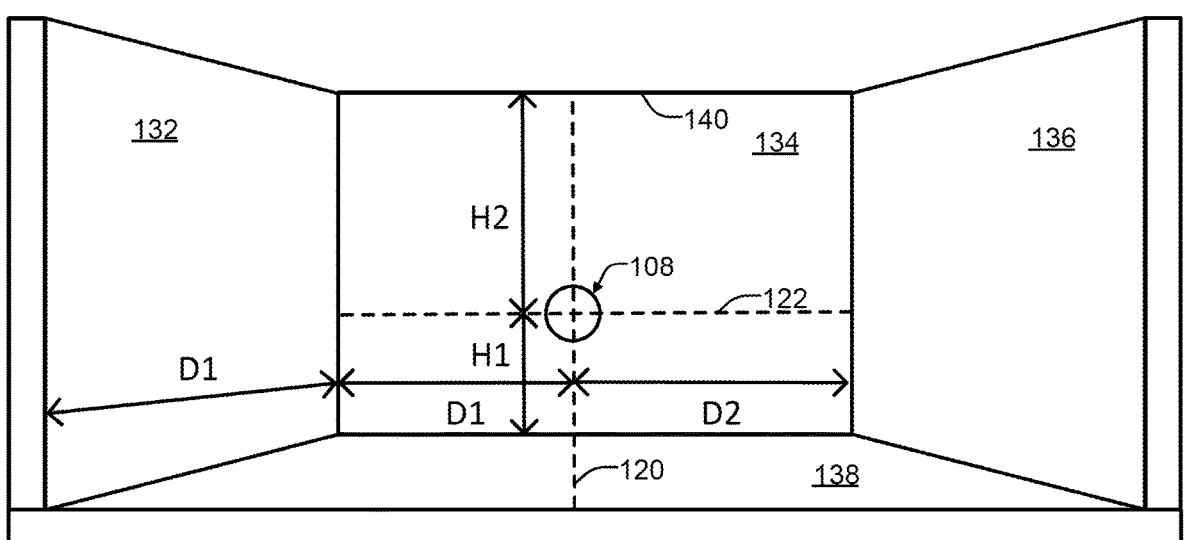

FIG. 2B illustrates a cross-sectional view along lines A-A of the housing 112 of FIG. 2A. In the provided example, to measure the chamber length, D1 and D2 are measured from an interior surface of walls 132 to a centerline 120, and from an interior surface of wall 136 to centerline 120, respectively. The centerline 120 is aligned with a center point of the hole 108 (e.g., with central axis 105). As shown, the centerline 120 bifurcates the chamber 130, such that dimensions of the wall 134 and floor 138 can be measured.

Further, height placement of the hole 108 on wall 134 can be determined by measuring a height H1 (e.g., approximately 6 mm) from the floor 138 to a second centerline 122 through the hole 108, and a height H2 (e.g., approximately 19 mm) from a top edge 140 of the wall 134, respectively. In some examples, a depth of the chamber 130 (e.g., a depth of one or more of the walls 132 and 136 is approximately equal to D1). In some examples, one or more of the walls 132 and 136 have a depth different from D1.

Although the provided example housing 112 is illustrated as having particular dimensions (e.g., internal, external, proportional, etc.), such examples are representative and do not limit the housing to such dimensions.

Figure 3:
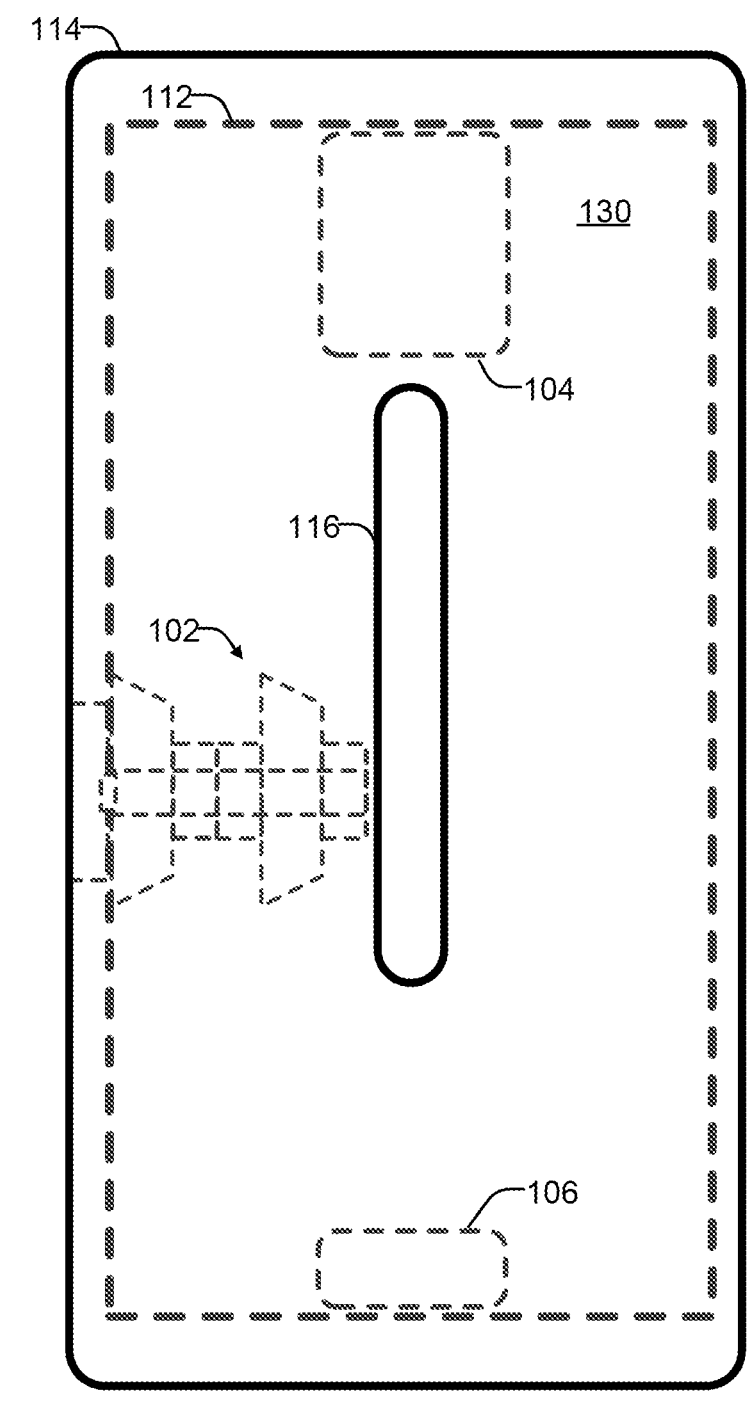
FIG. 3 illustrates an alternative view of the example ion implantation system of FIG. 1 with a cover.

FIG. 3 illustrates an overview of the example ion implantation system 100 of FIG. 1, with the chamber being enclosed by a cover 114. As shown, the housing 112, source 102, repeller 104, cathode 106, and chamber 130 are represented in dotted lines to indicate a solid cover 114 protecting the components within the system. The cover 114 includes a slit 116 arranged in a substantially central position, providing an ejection port for an aluminum ion beam. For instance, the slit 116 sits between the repeller 104 and cathode 106 and substantially at an end of the ion implantation device 102, such that ion beams generated within the chamber 130 are ejected through the slit 116.

Although the provided example slit 116 is illustrated as having representative dimensions (e.g., relative to the chamber 130, cover 114 and/or housing 112), they are exemplary and do not limit the slit to such dimensions. Further, the slit is illustrated with a particular shape (e.g., substantially oval and symmetrical), and arranged on the cover 114 at a particular location (e.g., substantially equidistant from the edges of the cover). However, the slit may be of any shape, orientation, and/or placement.

Figure 4:
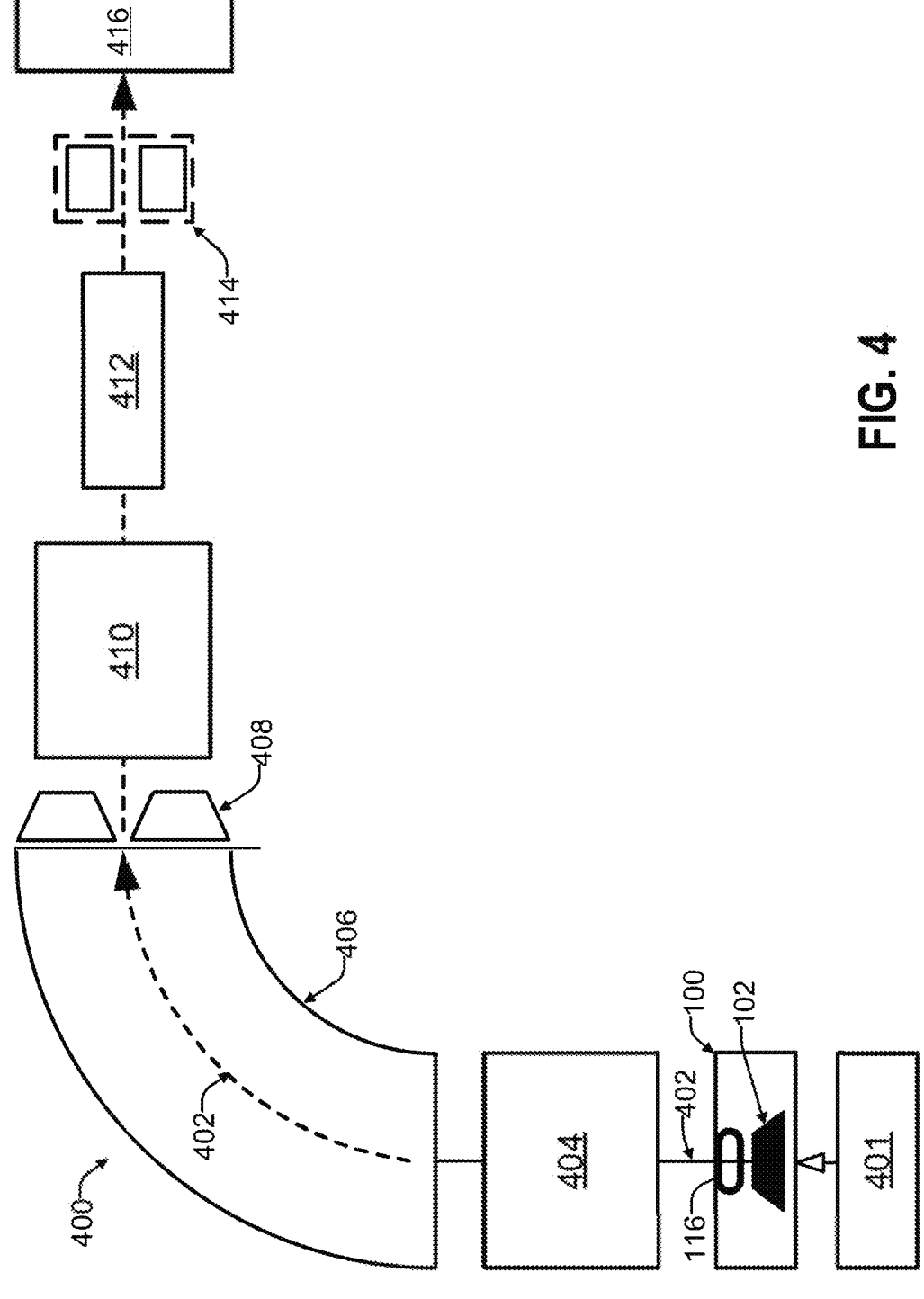
FIG. 4 illustrates a schematic of an example ion implantation system employing the example ion implantation device.

FIG. 4 illustrates a schematic of an example ion implantation system 400 employing the example ion implantation system 100, e.g., an ion implantation system and/or method to support the microelectronics industry. For example, ion beams 402 generated from the ion implantation device 102 within the system 100 are ejected through slit 116. This is achieved by introducing a displacing gas into the chamber from a gas source 401 during an ionization process to yield a beam of energetic aluminum ions. The ion beams are transmitted to an extractor 404 then to an analyzing magnet 406. The ion beams then pass through a filter 408, onto an accelerator 410 and focusing element 412 (e.g., one or more magnets). The ion beams are then directed to a scanner 414, which are then oriented toward a substrate 416 or other surface for implantation.

In the disclosed examples, an ion implantation device serving as a source of aluminum ions for an ionization process. The device includes a first segment of a first shape and a second segment of a second shape, wherein the first segment and second segment are fastened together to form a single plug configured to eject aluminum ions in the presence of a plasma.

In some examples, the first segment serves as a base for the device and the second segment is stacked on the first segment.

In some examples, the first segment has a first diameter and the second segment has a second diameter smaller than the first diameter.

In some examples, the first segment has an angled side surface between a first planar side and a second planar side.

In some examples, the second segment is cylindrical.

In some examples, the first and second segments comprise a ceramic plug. In examples, the ceramic plug is formed of Al2O3.

In some examples, the device comprises two of the first segments and three of the second segments.

In some disclosed examples, an ion implantation system includes a housing containing an ionization chamber; a cathode and a repeller arranged within the ionization chamber; and an ion implantation device configured as a source of aluminum ions, the ion implantation device comprising first and second segments fastened together and extending into the ionization chamber and configured to eject aluminum ions in the presence of a plasma.

In some examples, the ion implantation device comprises an Al2O3 ceramic plug.

In some examples, the housing further includes a hole configured to receive a fastener to secure the ion implantation device to a wall of the housing. In examples, the hole and the ion implantation device are arranged within the chamber at a greater distance from the repeller than the cathode.

In some examples, the housing further includes a cover having a slit, the cover configured to enclose the ionization chamber and orient an ejected ion beam through the slit. In examples, the ion implantation device is arranged to extend up to but not beyond an opening defined by the slit.

In some examples, the system also includes a fastener to fasten the first and second segments together. In examples, the fastener extends through a threaded channel within the first and second segments to fasten the first and second segments together. In examples, an outermost diameter of ion implantation device corresponds to a diameter of the first segment measured about a central axis aligned with the fastener.

In some disclosed examples, an ion implantation system employs an ion implantation device. The system includes an ion implantation system comprising: a housing containing an ionization chamber; a cathode and a repeller arranged within the ionization chamber; and an ion implantation device configured as a source of aluminum ions, the ion implantation device comprising first and second segments fastened together and extending into the ionization chamber and configured to eject aluminum ions in the presence of a plasma; and a gas source to introduce a displacing gas into the chamber during an ionization process to yield a beam of energetic aluminum ions.

In some examples, the beam of energetic aluminum ions has a current of approximately 3.5 mA.

In some examples, the system includes a scanner to direct the of energetic aluminum ions toward a substrate for implantation.

The foregoing description of preferred and other embodiments is not intended to limit or restrict the scope or applicability of the inventive concepts conceived of by the Applicants. It will be appreciated with the benefit of the present disclosure that features described above in accordance with any embodiment or aspect of the disclosed subject matter can be utilized, either alone or in combination, with any other described feature, in any other embodiment or aspect of the disclosed subject matter.

The invention claimed is:

1. An ion implantation device serving as a source of aluminum ions for an ionization process, the ion implantation device comprising:

a first segment of a first shape; and a second segment of a second shape, wherein the first segment and second segment are fastened together to form a single plug configured to eject aluminum ions in a presence of a plasma; and wherein the ion implantation device comprises two of the first segment and three of the second segment.

2. The ion implantation device according to claim 1, wherein one of the first segments serves as a base for the ion implantation device and one of the second segments is stacked on the one of the first segments.

3. The ion implantation device according to claim 1, wherein each first segment has a first diameter and each second segment has a second diameter smaller than the first diameter.

4. The ion implantation device according to claim 1, wherein each first segment has an angled side surface between a first planar side and a second planar side.

5. The ion implantation device according to claim 1, wherein each second segment is cylindrical.

6. The ion implantation device according to claim 1, wherein the single plug is a ceramic plug.

7. The ion implantation device according to claim 6, wherein at least one of the first and second segments is formed of Al2O3.

8. An ion implantation system comprising:

a housing forming an ionization chamber;

a cathode and a repeller arranged within the ionization chamber; and an ion implantation device serving as a source of aluminum ions, the ion implantation device comprising first and second segments fastened together and extending into the ionization chamber and configured to eject aluminum ions in a presence of a plasma; and wherein the housing includes a hole configured to receive a fastener to secure the ion implantation device to a wall of the housing.

9. The ion implantation system according to claim 8, wherein the ion implantation device forms an Al2O3 ceramic plug.

10. The ion implantation system according to claim 8, wherein the hole and the ion implantation device are arranged within the ionization chamber at a greater distance from the repeller than the cathode.

11. The ion implantation system according to claim 8, further comprising:

a cover having a slit;

wherein the cover encloses the housing forming the ionization chamber; and wherein the slit is oriented to permit passage of an ion beam ejected from the ionization chamber.

12. The ion implantation system according to claim 11, wherein the ion implantation device is arranged to extend up to but not beyond an opening defined by the slit.

13. An ion implantation system comprising:

a housing forming an ionization chamber;

a cathode and a repeller arranged within the ionization chamber; and an ion implantation device serving as a source of aluminum ions, the ion implantation device comprising first and second segments fastened together and extending into the ionization chamber and configured to eject aluminum ions in a presence of a plasma; and a fastener to fasten the first and second segments together.

14. The ion implantation system according to claim 13, wherein the fastener extends through a threaded channel within the first and second segments to fasten the first and second segments together.

15. The ion implantation system device according to claim 14, wherein an outermost diameter of the ion implantation device corresponds to a diameter of the first segment measured about a central axis aligned with the fastener.

16. The ion implantation system according to claim 13, further comprising a gas source to introduce a displacing gas into the ionization chamber during an ionization process to yield a beam of energetic aluminum ions.

17. The ion implantation system according to claim 16, wherein the beam of energetic aluminum ions has a current of approximately 3.5 mA.

18. The ion implantation system according to claim 16, futher comprising a scanner to direct the energetic aluminum ions toward a substrate for implantation.

19. An ion implantation device serving as a source of aluminum ions for an ionization process, the ion implantation device comprising:

a first segment of a first shape;

a second segment of a second shape; and a fastener that extends through a channel within the first and second segments to fasten the first and second segments together to form a plug configured to eject aluminum ions in a presence of a plasma.

20. The ion implantation device according to claim 19, wherein the first segment serves as a base for the ion implantation device and the second segment is stacked on the first segment.

21. The ion implantation device according to claim 19, wherein the first segment has a first diameter and the second segment has a second diameter smaller than the first diameter.

22. The ion implantation device according to claim 19, wherein:

the first segment has an angled side surface between a first planar side and a second planar side; and the second segment is cylindrical.

23. THE ion implantation device according to claim 19, wherein the first segment comprises Al2O3 and the second segment comprises Al2O3.

* * * * *